United States Patent [19]

Bright et al.

[11] 4,343,524
[45] Aug. 10, 1982

[54] ZERO INSERTION FORCE CONNECTOR

[75] Inventors: Edward J. Bright, Elizabethtown; Larry E. Dittmann, Harrisburg; Van K. Webster, Camp Hill, all of Pa.

[73] Assignee: AMP Incorporated, Harrisburg, Pa.

[21] Appl. No.: 164,199

[22] Filed: Jun. 30, 1980

[51] Int. Cl.³ .......................................... H01R 13/629
[52] U.S. Cl. ................................ 339/74 R; 339/75 M
[58] Field of Search ........ 339/17 CF, 176 MP, 75 M, 339/75 MP, 74 R

[56] References Cited

U.S. PATENT DOCUMENTS

| | | | |
|---|---|---|---|
| 3,231,848 | 1/1966 | Ruehlemann | 339/176 MP |
| 3,683,317 | 8/1972 | Walkup | 339/75 MP |
| 3,744,005 | 7/1973 | Sitzler | 339/75 MP |
| 3,763,459 | 10/1973 | Millis | 339/75 M |
| 4,080,032 | 3/1978 | Cherian et al. | 339/75 M |

Primary Examiner—John McQuade
Attorney, Agent, or Firm—Allan B. Osborne

[57] ABSTRACT

The present invention relates to a connector for electrically connecting a dual in-line package (DIP) to a printed circuit board or the like. More specifically, the invention discloses a lower housing having a plurality of contact members and a movable upper housing which opens the contact members to admit the leads extending from the DIP.

9 Claims, 10 Drawing Figures

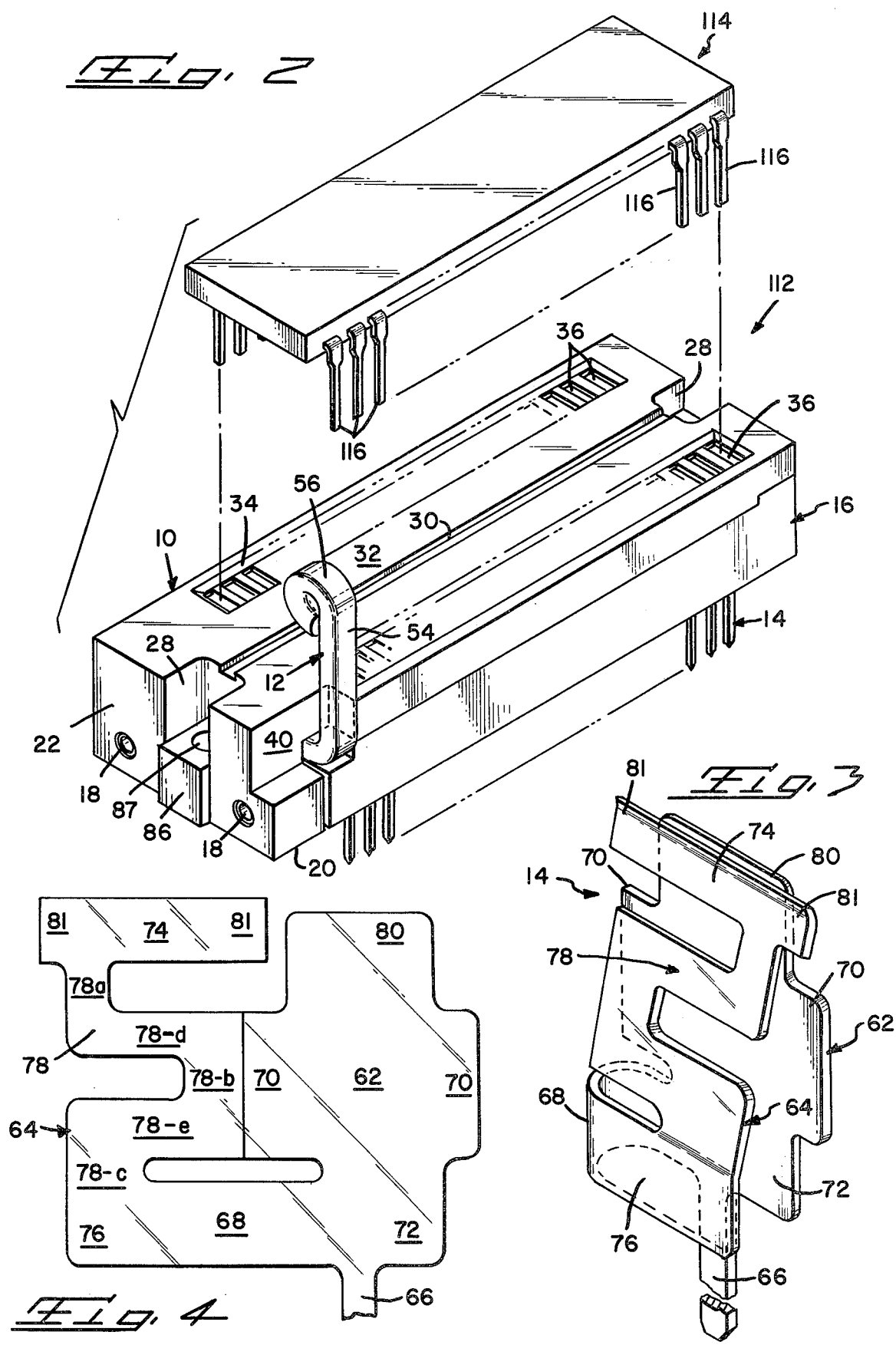

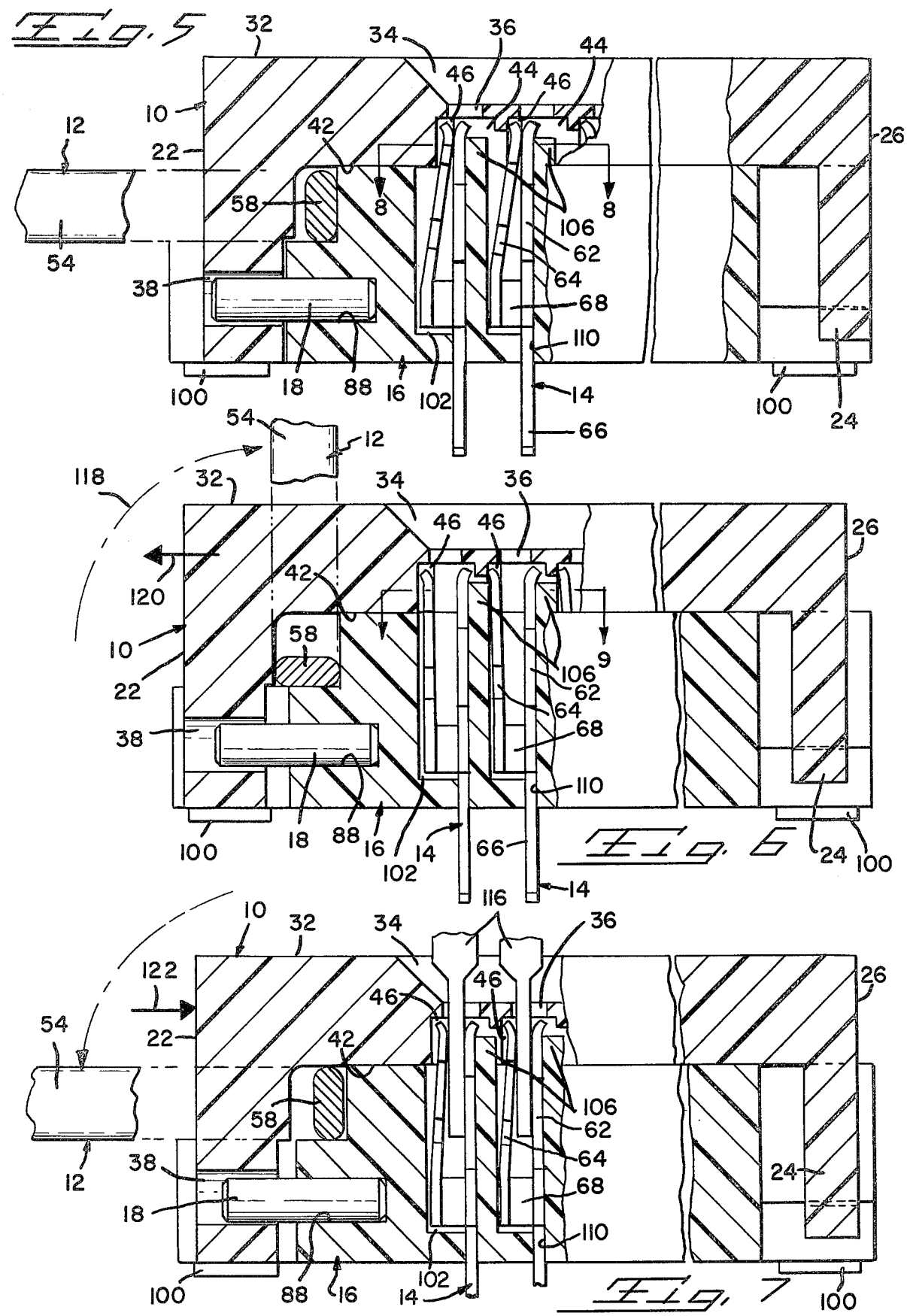

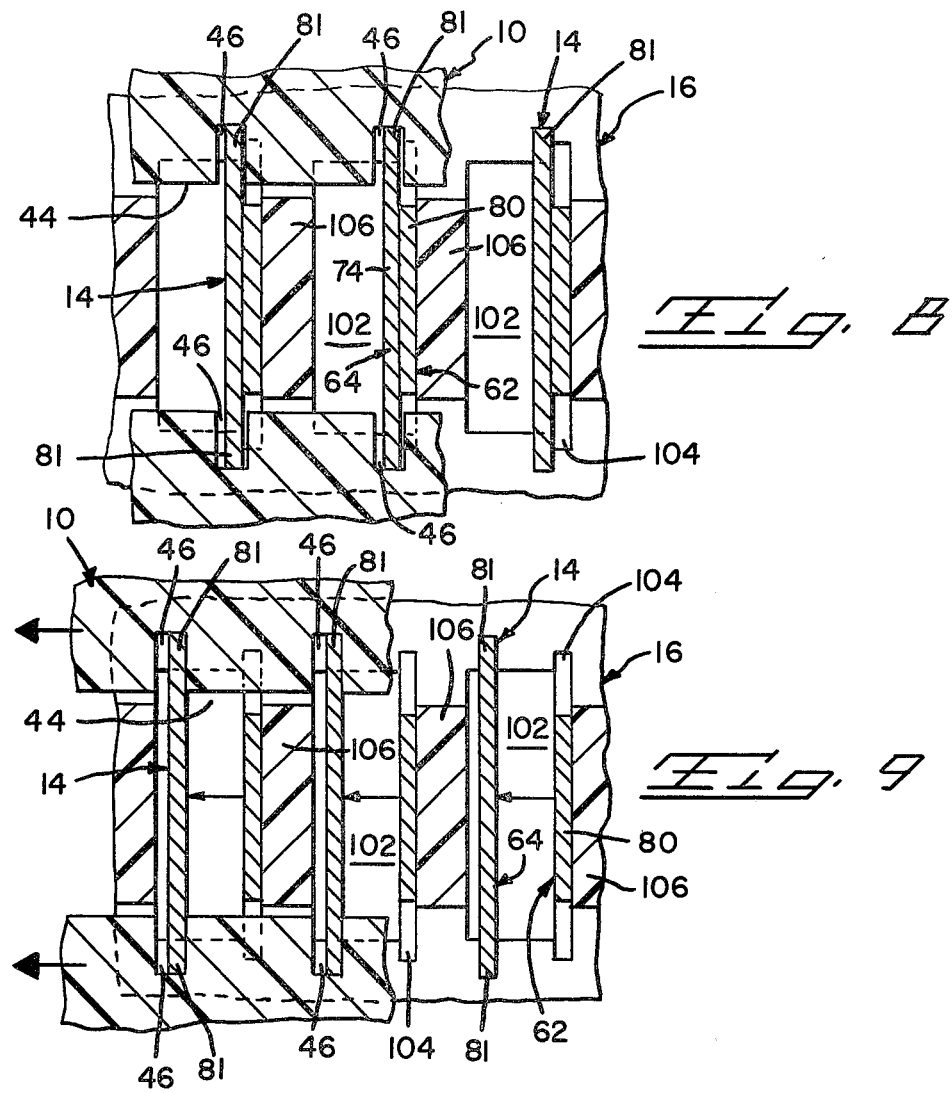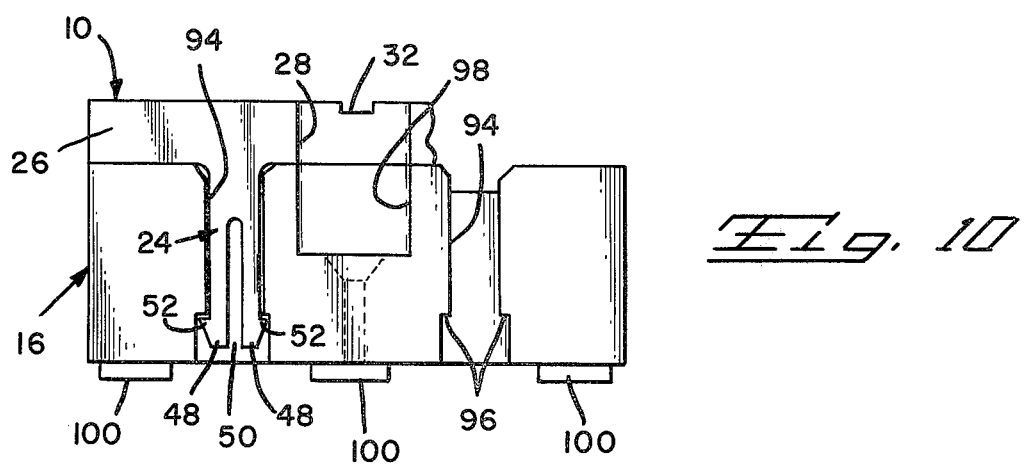

ZERO INSERTION FORCE CONNECTOR

BACKGROUND OF THE INVENTION

1. The Field of the Invention

The present invention relates to connectors, sometimes referred to as DIP sockets, which are fixed to a printed circuit board and into which electronic packages known as dual in-line packages are removably plugged. Conductive contact members in the connectors or sockets transmit current between the DIP and PCB.

2. Prior Art

The present invention is a novel improvement and a departure from at least the following:

| Patent No. | Patentee | Class/Subclass |
|---|---|---|
| 3,763,459 | Millis | 339/75 M |
| 4,080,032 | Cherian et al | 339/75 M |

A conflict has existed between the desired electrical conductivity between the contact members in a connector and the leads on a DIP and the amount of force required to insert the leads into the connector. Prior art connectors other than the two noted above traded low insertion forces for good electrical contact. The trade-off was logical in that as a general rule, once the DIP was inserted, it was seldom removed. Accordingly, good electrical performance was the primary and in some cases, the only parameter of interest.

The trade-off, however, is not acceptable in those connectors used for testing and evaluating integrated circuits and electronic components in the DIP. In this situation, DIP's are plugged into a connector, tested and then removed. In plants making DIP's for example, such testing is on an assembly line basis with a DIP's being plugged in, tested, and removed. Under these conditions, any but zero or low insertion forces would cause a time loss and a great many bent DIP leads. However, good electrical conductivity is still required. Workers in the field have been generally successful in achieving the best of two worlds: low or zero insertion forces plus good electrical conductivity. The two patents noted above are examples thereof. Connectors disclosed in both patents include means for opening double arm contact members so that the DIP leads may be easily inserted and removed. In Cherian et al, the contact members have two arms positioned transverse to the connector's longitudinal axis. The inside arms are latched to transversely moving members which are moved by a centrally located and longitudinally moving member via cooperating ramps. As the central member is moved, the transversely moving members pull the inside arms away from the outside arms so that the DIP may be inserted or removed.

In Millis, the connector or socket as referred to in his patent, is of a three piece layered construction with the middle member movable axially. The U-shaped contact members are positioned in the socket and extend up through openings in the middle and upper members. The openings in these members through which the arms extend have concave surfaces so upon moving the middle member, the concave surfaces curve the arms around the leads.

SUMMARY OF THE INVENTION

The present invention is a connector of novel design having utility as a vehicle in repeated testing and evaluating processes wherein dual in-line packages are rapidly inserted into the connector, tested, and removed. The connector has a limited number of components; a lower housing designed to contain a number of contact members having parallel arms, one of which is biased towards the other to grip a DIP lead thereinbetween; an upper housing slidly mounted on the lower housing and adapted to pull the biased arm away from the other upon being moved axially and means to move the upper housing axially. The contact members also include pins which extend out of the underside of the lower housing and which are adapted for insertion into a printed circuit board or the like.

BRIEF DESCRIPTION OF THE DRAWINGS

FIG. 2 shows the connector of FIG. 1 assembled and a DIP above ready for insertion;

FIG. 3 is an enlarged view of a contact member of the present invention;

FIG. 4 is an enlarged view of the contact member of FIG. 3 after being blanked out from flat stock and prior to being formed;

FIGS. 5, 6 and 7 are sequential views of the connector being opened to receive a DIP lead and then closed, the drawings being in elevation cross-section;

FIGS. 8 and 9 are top plan cross-sectional views of the connector in a closed and open position respectively, the drawings being taken along line 8—8 of FIG. 5 and line 9—9 of FIG. 6; and FIG. 10 illustrates one manner in which the upper housing is slidably latched to the lower housing.

DESCRIPTION OF THE INVENTION

Figure 1:
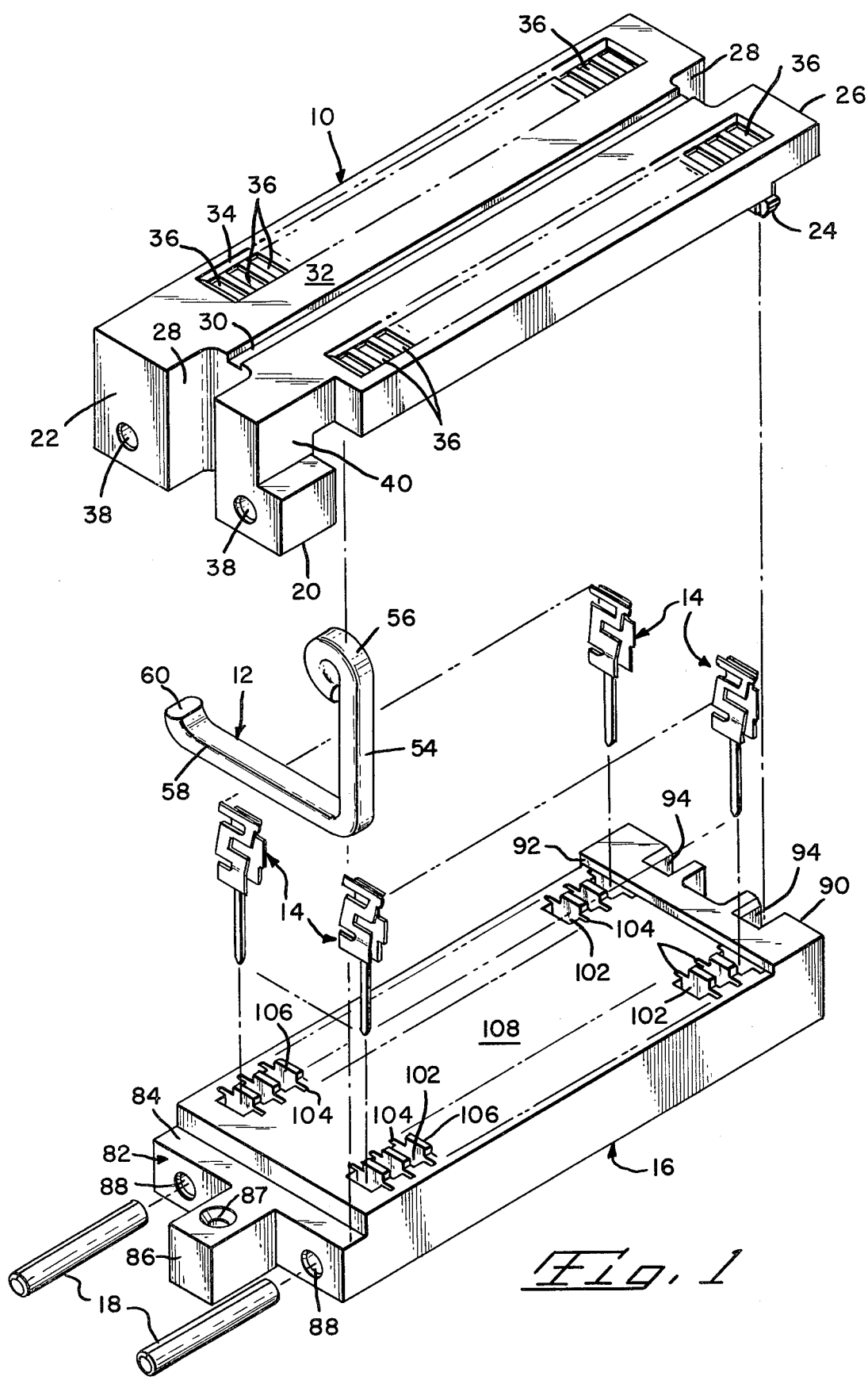
FIG. 1 is a perspective view of the connector of the present invention with the several components being exploded out.

FIG. 1 shows perspectively the several components of the connector of the present invention. From top to bottom they are: upper housing 10, lever 12, contact members 14, lower housing 16, and rods 18.

Upper housing 10 is L-shaped with the short leg being a vertical wall 20 extending downwardly at the front end 22. Two split pins 24 (see also FIG. 10) extend downwardly from the back end 26. Both ends of the upper housing are bisected by U-shaped, vertical cut outs 28. Slot 30, extending down the length of the upper surface 32, connects the two cut outs.

Two elongated, upwardly opened recesses 34, one on either side of slot 30, extend for most of the length of the upper surface. A plurality of openings 36, extending vertically through the upper housing, are located in the two recesses.

A pair of holes 38 extend horizontally through vertical wall 20, these holes being located adjacent each side and near the base.

The side of wall 20 facing out of the plane of the paper is cut away, as indicated generally by reference numeral 40. The purpose is to provide clearance for lever 12.

FIGS. 5 and 8 are now referred to for describing the internal structure of upper housing 10. The downwardly, facing surface 42 has two downwardly opening recesses 44 which are in alignment with recesses 34 located in the upper surface 32. A plurality of notches 46 are located in the side walls defining the recesses 44. These laterally extending notches are positioned below and immediately forward of each opening 36 and on each side of each recess as shown clearly in FIG. 8.

The structure of split pins 24 may be seen in the one illustrated in FIG. 10. The pins include two fingers 48 defined by slot 50, and at the free ends of the fingers, upwardly facing shoulders 52. The free ends are bevelled inwardly below the shoulders for ease of insertion into the lower housing.

Upper housing 10 is preferably molded from a plastic molding compound such as polyphenylene sulfide. Lever 12 is used to move upper housing 10 axially. Accordingly, it is made from a rigid material such as annealed stainless steel wire. The wire is rectangular in cross-section with rounded edges. The width of the wire is equal to the distance the upper housing needs to move.

The free end of leg 54 of the lever is bent around back on itself to form a finger grip 56. The second leg 58 is bent to lie at a ninety degree angle relative to the first leg. The free end 60 of the second leg is bent up to also lie at right angles thereto to retain the lever in the housings.

Contact member 14 is shown in detail in FIG. 3. FIG. 4 shows the contact member blanked out of flat stock prior to being formed. The material used is preferably beryllium copper with a tin-lead or gold plating.

Each contact member has four distinct parts; a first arm 62, a second arm 64, pin 66 and strap 68. The general shape of a contact member 14 faintly suggests a non-symmetrical Y with the two facing arms being the branches and the pin providing the tail. The placement of strap 68; i.e., being attached to adjacent sides of the two arms, distorts the symmetry.

Two laterally-projecting ears 70 are positioned on first arm 62 ith one ear on each side. Pin 66 extends downwardly from lower portion 72 of the first arm. The first arm's solid body provides strength to the contact member.

The structural elements of the second arm include top portion 74, lower portion 76, and intermediate portion 78. Top and lower portions are positioned horizontally. The intermediate portion has three vertical elements 78-a, 78-b, 78-c and two horizontal elements 78-d and 78-e.

Top portion 74 extends laterally beyond the sides of the top portion of first arm 62, indicated by reference numeral 80. The laterally extending free ends of top portion 74 are indicated by reference numeral 81.

As illustrated in FIG. 3, the lower portions on the two arms are parallel with each other. Immediately above lower portion 76, second arm 64 has been bent in to where top portion 74 thereof touches top portion 80 of first arm 62. The degree of bending actually would place top portion 74 on the other side of the first arm. This preloads the second arm.

Strap 68 connects the two arms together, the connection members 14 may be made from any suitable conductive material with beryllium copper being preferred.

Lower housing 16 has a rectangular shape with essentially the same dimensions as upper housing 10 with respect to length and width. Front end 82 of the lower housing is displaced downwardly to provide a ledge 84. Further, a middle portion extends forwardly to provide a mounting block 86. A hole 87 extends vertically through the block. Apertures 88, one on either side of the mounting block, extend horizontally into the lower housing.

Back end 90 of lower housing 16 has three vertical cut-outs which open out upwardly and rearwardly. With reference to FIG. 10, the two outer cut-outs, indicated by reference numeral 94, extend through the vertical length of the lower housing and are counterbored adjacent their lower ends to provide downwardly facing shoulders 96. The middle cut-out, designed by reference numeral 98, extends only part way down. A vertical hole similar to hole 87 in mounting block 86 is provided in the lower half as shown by dashed lines.

As shown in FIG. 5 the under surface of both front and back ends have a number of short legs 100 which serve to hold the housing up from the surface of a printed circuit board (not shown).

Returning to FIG. 1, two rows of cells 102 are located in the body of the lower housing; i.e., between the front and back ends. The cells, which extend vertically into the lower housing, are rectangular in shape with laterally extending slots 104 provided at the back sides. A bar 106 extends vertically above upper surface 108 of the lower housing at the back of each cell.

With reference to FIG. 5, it can be seen that the cells extend downwardly into the lower housing for most of its thickness. A pin-receiving bore 110 connects the cells with the under surface of the lower housing.

Lower housing 16 is preferably molded from the same material as upper housing 10.

Connector 112 of the present invention is shown in FIG. 2 along with a conventinal DIP 114. Leads 116 on the DIP are adapted for insertion into connectors such as the one disclosed herein.

The assembly of connector 112 from the above described components will now be described.

Contact members 14 are loaded into cells 102 with ears 70 on first arm 62 being received in slots 104. The ears so positioned retain the first arm against horizontal movement. Top portion 80 bears against bar 106 as can be seen in FIG. 5. Pin 66 is positioned in bore 110 with the free end of the pin extending below the lower housing for insertion into a printed circuit board.

Top portion 74 of second arm 64 also extends above upper surface 108 of the lower housing.

Second leg 58 of lever 12 is placed onto ledge 84 of the front end of the lower housing and the lever held with the first leg horizontal as shown in FIG. 5 while the upper housing 10 is positioned on top of the lower housing. The split pins 24 are pushed through cut-outs 94 so that the upwardly facing shoulders 52 catch in under downwardly facing shoulders 96.

Front end vertical wall 20 on upper housing 10 slides down in front of front end 82 on the lower housing. With holes 38 in alignment with apertures 88, rods 18 are pushed in as shown in FIG. 5. The diameter of apertures 88 and rods 18 are selected so that there is an interference fit in between. The diameter of holes 38 is larger so that upper housing 10 can slide freely on the rods.

With the upper housing being positioned on top of the lower housing, free ends 81 on top portion 74 on second arm 64 are received into notches 46. FIGS. 8 and 9 shows this arrangement clearly. Connector 112 may be plugged into a PCB and retained thereon by screws (not shown) extending through holes 87 and into the board.

FIGS. 5 through 9 illustrate the operation of connector 112. FIG. 5 is a view of the connector as assembled;

i.e., the first leg of lever 12 is horizontal and the second arm 64 is bearing against first arm 62. Openings 36 in the upper housing are not in alignment with cells 102 in the lower housing. FIG. 8 is the same view but taken from above; i.e., along line 8—8 in FIG. 5.

FIG. 6 is a view taken after lever 12 has been rotated in the direction of arrow 118. That rotation moves upper housing 10 to the left; i.e., in the direction of arrow 120. The amount of travel is equal to the width of leg 58 on lever 12. The upper housing moves the second arms 64 on contact members 14 away from first arms 62 by reason of the free ends 81 being positioned in notches 46. Also, openings 36 are now in alignment with cells 102 and the space between the two open arms 62-64 on the contact members. FIG. 9 shows the relationships as seen from above.

FIG. 7 is a view taken after leads 116 of DIP 114 have been inserted through openings 36 and in between the first and second arms of contact members 14. Lever 12 has been rotated back to the horizontal position of FIG. 5. Upper housing 10 moves back; i.e., in the direction of arrow 122 under the combined spring forces of the second arms 64.

Of the several novel features of connector 112, second arm 64 is the most significant.

This second arm of contact member 14 is the spring component; i.e., it supplies the compressive force against a DIP lead that is inserted between it and the first arm.

The amount of available compressive force is a function of a spring physical characteristics plus any preload forces. As is well known, the factors which control spring design includes the desired compressive force, the distance the spring can be deflected, the maximum deflection force available, a factor which may be limited by housing materials and dimensions, spring material and available space, particularly width. In the present invention, the available physical space and housing material and construction severely limited the overall contact member size and its first and second arms. Accordingly, the second arm structure was invented to take advantage of the greater efficiencies offered by torsion springs as opposed to conventional cantilever beam-type springs; i.e., where most of the force is concentrated at the point of bending.

The novel spring design disclosed herein utilizes all the second arm plus strap 68. The manner in which the spring works begins with the aforementioned preloading. The second arm, preferably while the contact member is still in the blanked out stage shown in FIG. 4, is bent over so that top portion 74 would be beyond the first arm after forming but for the interference by that arm.

The contact members are positioned in cells 102 with second arm 64 bearing against first arm 62; i.e., a 'normally closed' state. As upper housing 10 is moved forward by lever 12 and the second arms are pulled away from the first arms, the elements of the second arms bend and twist. Even though the deflection of the second arms are not great, the combined torsional and bending stresses provide a considerable amount of compressive forces which are available to be applied against the DIP leads.

After the leads are in place, the second arms are released to press against them. The compressive force is essentially constant but the combination of forces; i.e., torsional and bending, contributed by the several horizontal and vertical elements vary depending on the position of the lead. The following table sets forth a comparison between three positions of a lead with the left and right positions showing the changes from the center position.

| Second Arm Elements | POSITION OF LEAD | | |
| --- | --- | --- | --- |
| | Center | Left of Center* | Right of Center* |
| top portion 74 | zero torsion minor bending | zero torsion zero bending | zero torsion bending increases |
| vertical element 78-a | torsion bending | zero torsion bending is constant | torsion increases bending is constant |
| horizontal element 78-d | torsion very minor bending | torsion increases bending increases | torsion is constant bending increases |
| vertical element 78-b | torsion bending | torsion increases bending is constant | zero torsion bending is constant |
| horizontal element 78-e | torsion very minor bending | minor torsion zero bending | torsion is constant bending increases |
| vertical element 78-c | torsion bending | zero torsion bending is constant | torsion increases bending is constant |
| lower portion 76 strap 68 | torsion very minor bending | torsion increases bending increases | torsion decreases bending decreases |

*to where the lead is in line with the vertical elements.

The combination of forces on a lead positioned anywhere between the center and an end would be somewhere between the combinations given in the table in that they change linearly.

The present invention may be subject to many modifications and changes without departing from the spirit or essential characteristics thereof. The present embodiment should therefore be considered in all respects as illustrative and not restrictive of the scope of the invention.

What is claimed is:

1. A connector for receiving a dual in-line package or the like having a plurality of leads extending therefrom, said connector comprising:
   a. a lower housing of insulating material having a plurality of spaced apart cells opening upwardly on the top surface;
   b. an upper housing of insulating material slidably mounted on the top surface of the lower housing and having a plurality of spaced apart openings extending vertically therethrough;
   c. a plurality of resilient contact members having first and second arms in facing arrangement and hinged together at a lower portion thereof with the second arm being removably biased against the first arm, said second arm having a top portion with laterally extending free ends and a generally S-shaped intermediate portion providing at least one torsional axis said contact members being positioned in the cells of the lower housing with the first arms held immobile and with the laterally extending free ends on the second arms being coupled to the upper housing so that upon sliding the upper housing, the second arms are pulled away from the first arms and the intermediate portions twist about the one or more torsional axes thereby storing energy useful for exerting compressive forces on leads which may be inserted between the first and second arms through the openings in the upper housing.

2. The connector of claim 1 wherein the first and second arms of the contact members are joined together at their lower portions by a strap attached to and extending between adjacent sides.

3. The connector of claim 2 wherein the cells of the lower housing having laterally extending slots and the first arms on the contact members have laterally extending ears which are received in the slots to hold the first arms immobile.

4. The connector of claim 3 wherein the contact members further include a pin attached to and extending downwardly from the first arm for insertion into a PCB or the like, said lower housing having bores extending downwardly from the cells to the under surface for receipt of the pins.

5. The connector of claim 1 wherein the laterally extending free ends on the top portions of the second arms are received in notches adjacent to each opening in the upper housing.

6. The connector of claim 1 wherein the second arm generally describes an S-shape having vertical and horizontal elements, said elements capable of being placed under various torsional and bending stresses.

7. A connector for receiving an electronic package having leads extending therefrom, said connector comprising:
   a. upper and lower rectangularly shaped housings positioned together with one over the other and with one adapted to be longitudinally moved relative to the other, a plurality of cells located in the lower housing and opening out on its top surface adjacent to the under surface of the upper housing, a plurality of openings extending vertically through the upper housing, and means to move one housing relative to the other; and
   b. a plurality of contact members having first and second arms in face to face relation and electrically connected to each other, said contact members being positioned in said cells with the second arm attached to the upper housing so that as one housing moves longitudinally relative to the other housing the openings become aligned with said cells and the second arm is pulled away from the first arm to admit a lead from the electronic package through the opening and in between the arms, said second arm being generally S-shaped with horizontal and vertical elements that are adapted to be placed in torsional and bending stresses.

8. The connector of claim 7 further including means connected to said contact members and extending downwardly out through the lower housing for insertion into a printed circuit board.

9. A connector for electrically connecting a DIP or the like to a PCB, comprising:
   a. a lower housing of insulative material having two spaced apart rows of vertical cells open at the upper surface with narrow bores extending downwardly to the under surface, said cells having laterally extending notches at one end and the wall between cells extending above the upper surface;
   b. an upper housing of insulating material having two spaced apart rows of vertical openings therethrough and with notches on opposite sides of each openings in the underside surface of the upper housing, said upper housing being slidably positioned on the upper surface of the lower housing;
   c. a plurality of resilient contact members having first and second arms joined together by a lateral strap extending from one arm to the other adjacent the lower ends thereof, the first arm having a pin extending downwardly therefrom and ears extending outwardly from each side and said second arm having ears on each side adjacent the top edge, said members being positioned in the cells with the ears on the first arms being received in the notches on each side of the cells in the lower housing to retain those arms against horizontal movement and with the pins depending from the lower housing for insertion into a PCB and with the ears on the second arms being received in the notches on each side of the openings in the underside of the upper housing; and
   d. means for first sliding the upper housing longitudinally from a first position so that the second arm is pulled away from the first arm by virtue of the ears on the second arms being lodged in the notches in the upper housing and so that the openings in the upper housing come into line with the provided space between the first and second arms so that the legs on a DIP or the like may be inserted into the openings and in between the opened arms and secondly for returning the upper housing to the first position whereby the second arms close in on the first arms to compress the legs therebetween for electrical contact.

* * * * *